(12) United States Patent
Inoue et al.

(10) Patent No.: US 10,749,034 B2
(45) Date of Patent: Aug. 18, 2020

(54) SEMICONDUCTOR DEVICE, METHOD FOR PRODUCING SAME AND ALIPHATIC POLYCARBONATE

(71) Applicants: Japan Advanced Institute of Science and Technology, Ishikawa (JP); Sumitomo Seika Chemicals Co., Ltd., Hyogo (JP)

(72) Inventors: Satoshi Inoue, Ishikawa (JP); Tatsuya Shimoda, Ishikawa (JP); Nobutaka Fujimoto, Osaka (JP); Kiyoshi Nishioka, Hyogo (JP); Shuichi Karashima, Osaka (JP)

(73) Assignees: Japan Advanced Institute of Science and Technology, Ishikawa (JP); Sumitomo Seika Chemicals Co., Ltd., Hyogo (JP)

( * ) Notice: Subject to any disclaimer, the term of this patent is extended or adjusted under 35 U.S.C. 154(b) by 216 days.

(21) Appl. No.: 15/962,370

(22) Filed: Apr. 25, 2018

(65) Prior Publication Data

US 2018/0248047 A1 Aug. 30, 2018

Related U.S. Application Data

(62) Division of application No. 15/104,726, filed as application No. PCT/JP2014/083187 on Dec. 16, 2014, now Pat. No. 9,985,137.

(30) Foreign Application Priority Data

Dec. 16, 2013 (JP) .................................. 2013-259031

(51) Int. Cl.
*H01L 29/786* (2006.01)
*H01L 29/66* (2006.01)
(Continued)

(52) U.S. Cl.
CPC ........ *H01L 29/78618* (2013.01); *C09D 5/008* (2013.01); *C09D 7/61* (2018.01);
(Continued)

(58) Field of Classification Search
CPC ............. H01L 29/78618; H01L 21/385; H01L 21/477; H01L 29/24; H01L 29/78696;
(Continued)

(56) References Cited

U.S. PATENT DOCUMENTS 3,914,138 A 10/1975 Rai-Choudhury
4,404,731 A 9/1983 Poleshuk
(Continued)

FOREIGN PATENT DOCUMENTS

CN 101348605 A 1/2009
CN 101996870 A 3/2011
(Continued)

OTHER PUBLICATIONS

"Chinese Office Action", dated Aug. 28, 2018, Chinese IPO, for Chinese Application No. 20140067483.5, 7 pgs.
(Continued)

*Primary Examiner* — Bac H Au
(74) *Attorney, Agent, or Firm* — Buckley, Maschoff & Talwalkar LLC

(57) ABSTRACT

It is an object of the invention to provide a thin film transistor and a method for producing the same, which will easily achieve self-aligned formation of a source/drain region without through processes under a vacuum or a low pressure or with no use of expensive equipment.

17 Claims, 9 Drawing Sheets

(51) Int. Cl.
*C09D 7/61* (2018.01)
*C09D 5/00* (2006.01)
*C09D 169/00* (2006.01)
*H01L 21/385* (2006.01)
*H01L 21/477* (2006.01)
*H01L 29/24* (2006.01)
*C08G 64/02* (2006.01)

(52) U.S. Cl.
CPC .......... *C09D 169/00* (2013.01); *H01L 21/385* (2013.01); *H01L 21/477* (2013.01); *H01L 29/24* (2013.01); *H01L 29/66969* (2013.01); *H01L 29/7869* (2013.01); *H01L 29/78696* (2013.01); *C08G 64/02* (2013.01)

(58) Field of Classification Search
CPC ........... H01L 29/66969; H01L 29/7869; H01L 21/0231; H01L 21/324; H01L 2924/068; C09D 7/61; C09D 5/008; C09D 169/00; C08G 64/02
See application file for complete search history.

(56) References Cited

U.S. PATENT DOCUMENTS

| | | | |
|---|---|---|---|
| 4,965,872 A | 10/1990 | Vasudev | |
| 5,904,509 A | 5/1999 | Zhang et al. | |
| 5,929,467 A | 7/1999 | Kawai et al. | |
| 8,263,429 B2 | 9/2012 | Blochwitz-Nimoth et al. | |
| 8,617,992 B2 | 12/2013 | Chandra et al. | |
| 9,260,443 B2 | 2/2016 | Hawker et al. | |
| 2003/0117707 A1 | 6/2003 | Uchida et al. | |
| 2005/0181566 A1 | 8/2005 | Machida et al. | |
| 2007/0155051 A1 | 7/2007 | Wang et al. | |
| 2009/0246415 A1 | 10/2009 | Horie et al. | |
| 2010/0072416 A1 | 3/2010 | Fujioka et al. | |
| 2011/0033999 A1 | 2/2011 | Kono et al. | |
| 2011/0274908 A1 | 11/2011 | Kowata et al. | |
| 2012/0168728 A1* | 7/2012 | Hawker | B82Y 30/00 257/40 |
| 2014/0021465 A1* | 1/2014 | Facchetti | H01L 29/78693 257/43 |
| 2014/0124741 A1 | 5/2014 | Shukla et al. | |
| 2014/0128551 A1 | 5/2014 | Shukla et al. | |
| 2015/0166888 A1 | 6/2015 | Katsumoto et al. | |
| 2017/0174961 A1 | 6/2017 | Niiyama et al. | |

FOREIGN PATENT DOCUMENTS

| | | |
|---|---|---|
| JP | 51-44869 A | 10/1975 |
| JP | 2005-72012 A | 3/2005 |
| JP | 2005-260040 A | 8/2005 |
| JP | 2006-140335 A | 6/2006 |
| JP | 2006140335 A | 6/2006 |
| JP | 2007523460 A | 8/2007 |
| JP | 2010-533983 A | 10/2010 |
| JP | 2011-40453 A | 2/2011 |
| JP | 2013-110175 A | 6/2013 |
| TW | 1643883 B | 12/2018 |
| WO | 2005/079466 A3 | 9/2005 |

OTHER PUBLICATIONS

"English-language Translation of Chinese Office Action", dated May 14, 2018, Chinese IPO, for Chinese Application No. 201480067483.5, 7 pgs.
"Japanese Office Action", draft dated Nov. 22, 2018, Japanese IPO, for Japanese Application No. 2015-553541, 3 pgs.
"English-language Translation of Japanese Office Action", draft dated Nov. 22, 2018, Japanese IPO, for Japanese Application No. 2015-553541, 3 pgs.
"Taiwanese Office Action", dated May 14, 2018, Taiwan IPO, for Taiwanese Application No. 10720432490, 3pgs.
"English-language Translation of Taiwanese Office Action", dated May 14, 2018, Taiwan IPO, for Taiwanese Application No. 10720432490, 2pgs.
"PCT International Search Report", Patent Cooperation Treaty, dated Feb. 3, 2015 (Feb. 3, 2015), PCT International Application No. PCT/JP2014/083187, 2pgs.
"Taiwanese Office Action", drafted dated Mar. 22, 2019, TIPO, for Taiwanese Application No. 107123931, 5 pgs.
"English-language Translation of Taiwanese Office Action", drafted Mar. 22, 2019, TIPO, for Taiwanese Application No. 107123931, 3 pgs.

\* cited by examiner

[FIG. 1]
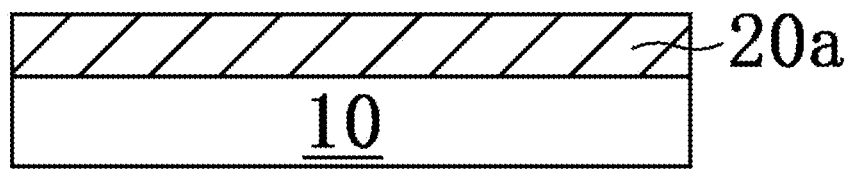
[FIG. 2]
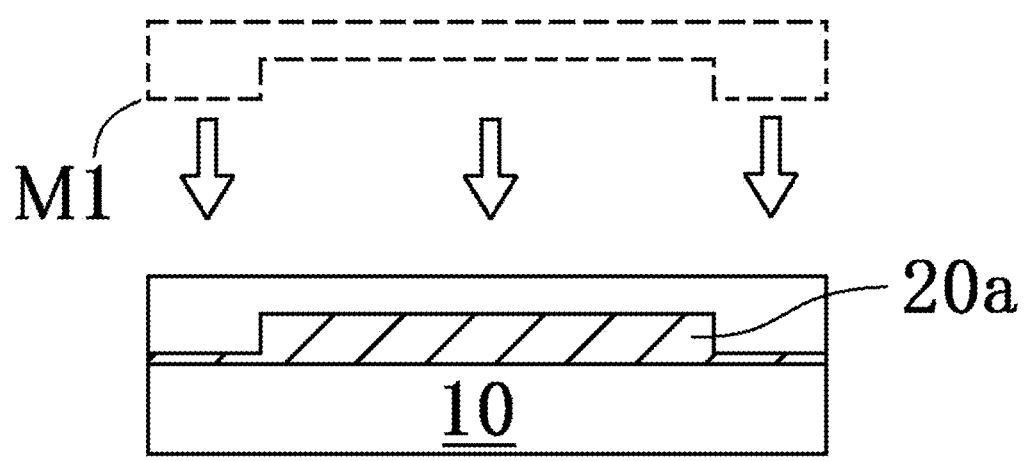

[FIG. 3]
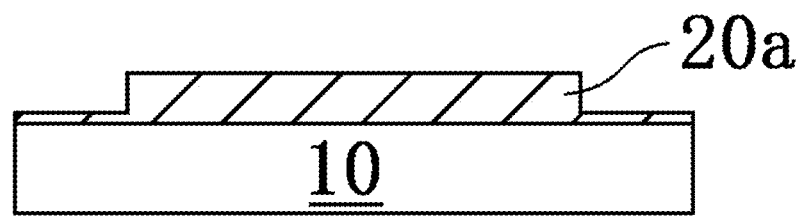
[FIG. 4]
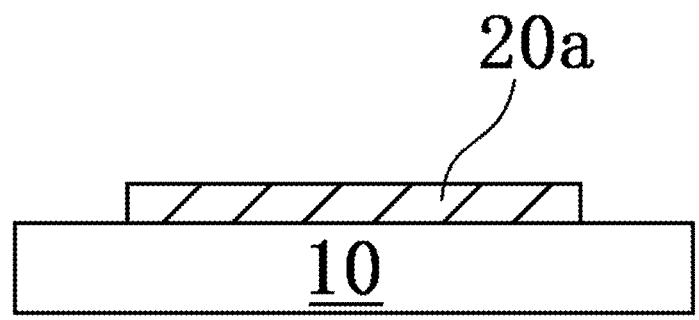

[FIG. 5]
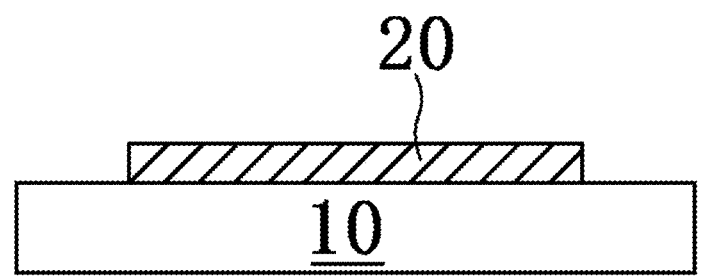
[FIG. 6]
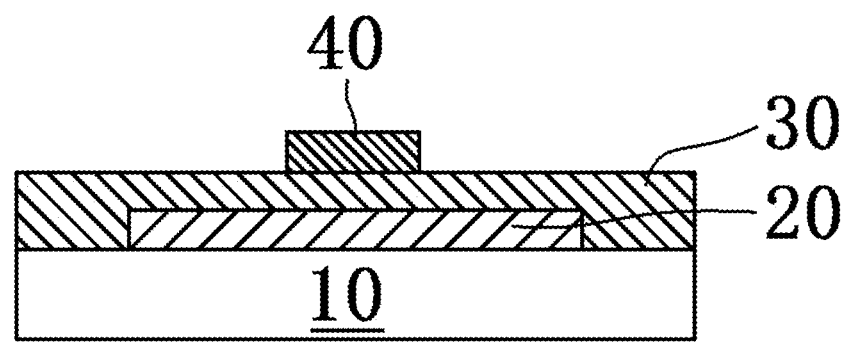

[FIG. 7]
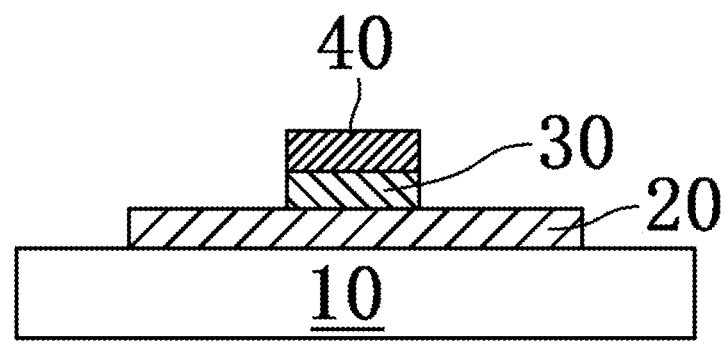
[FIG. 8]
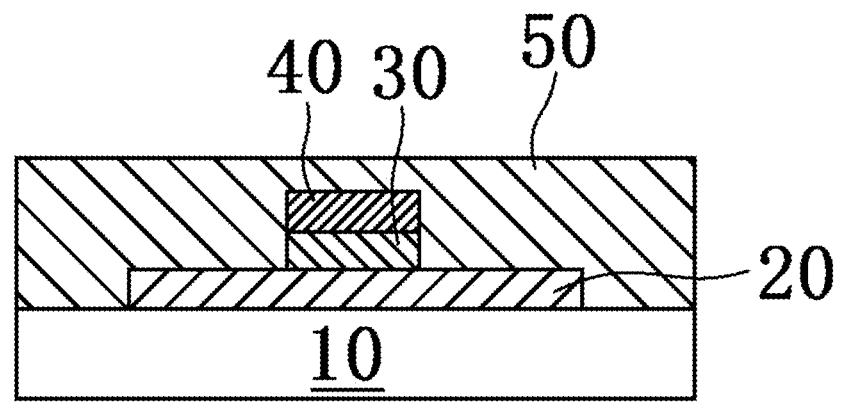

[FIG. 9]
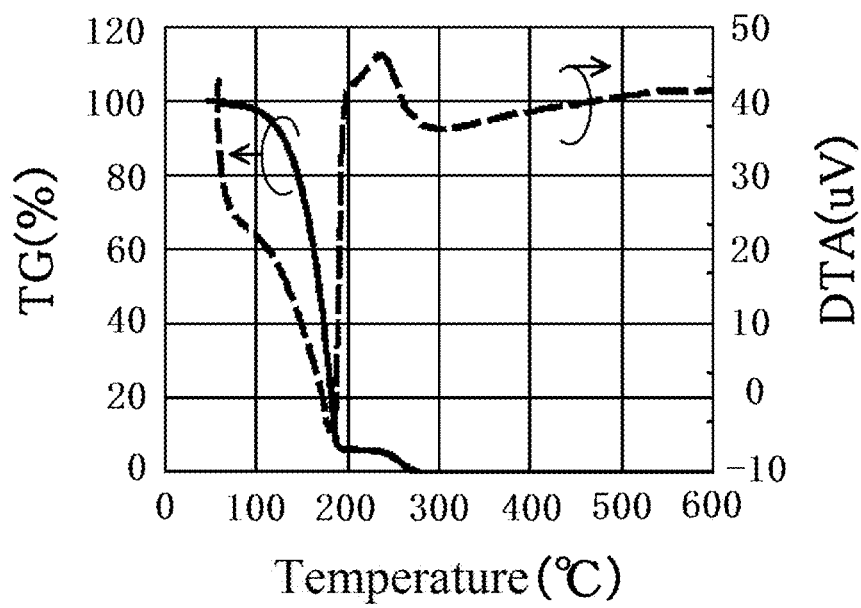
[FIG. 10]
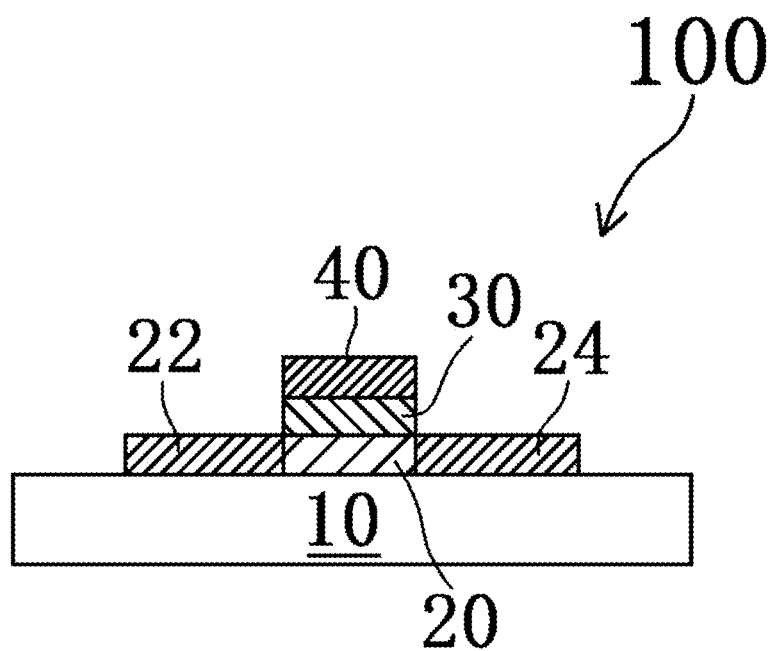

[FIG. 11]
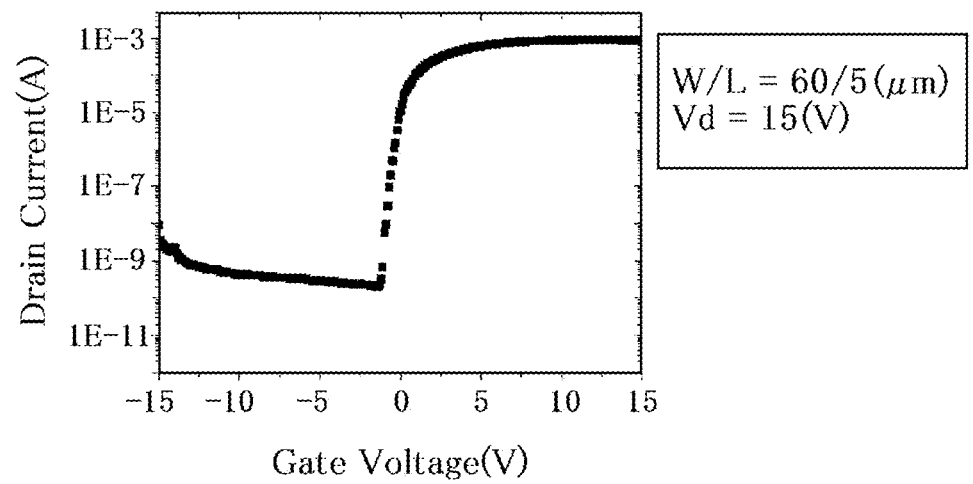
[FIG. 12]
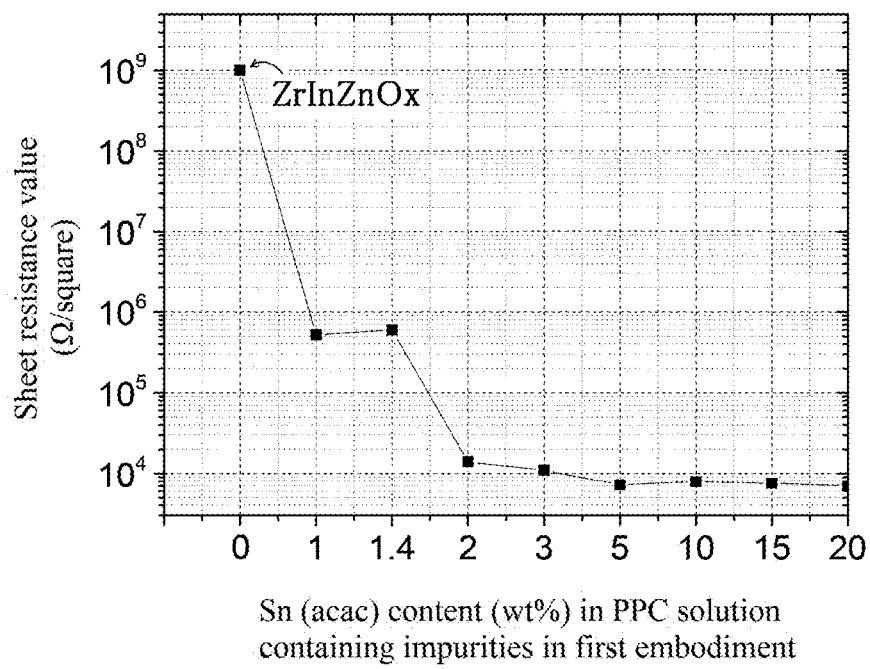
Sn (acac) content (wt%) in PPC solution
containing impurities in first embodiment

[FIG. 13]
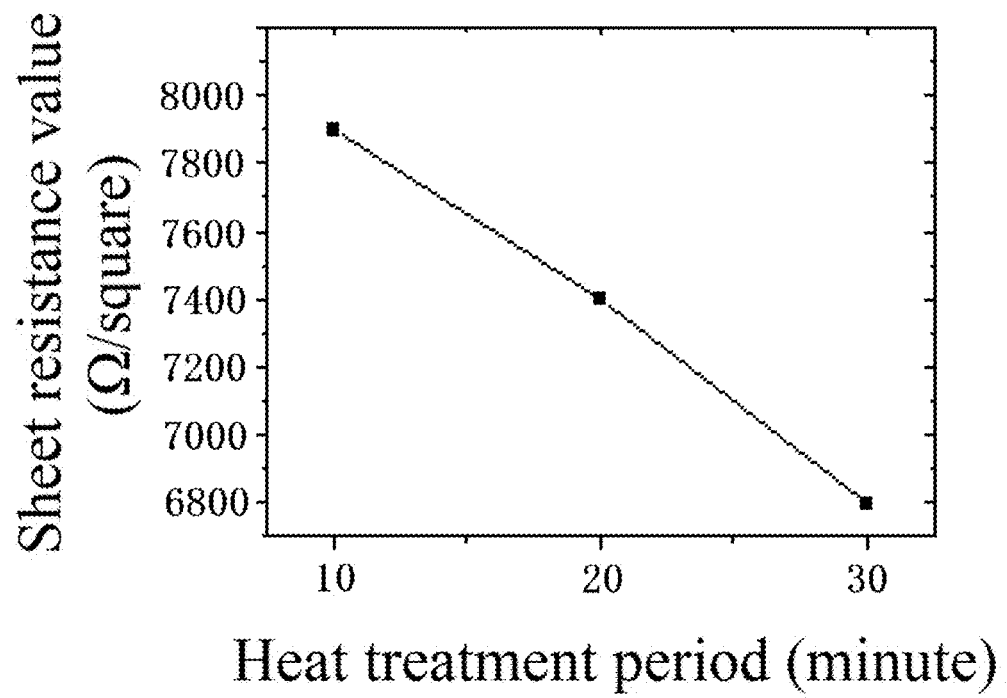

[FIG. 14]
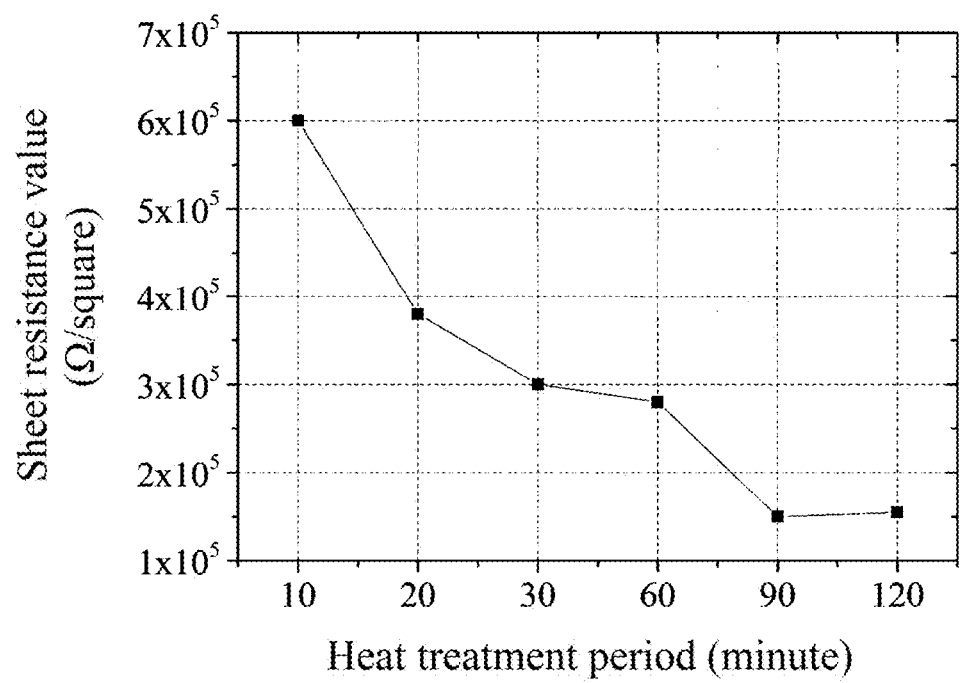
[FIG. 15]
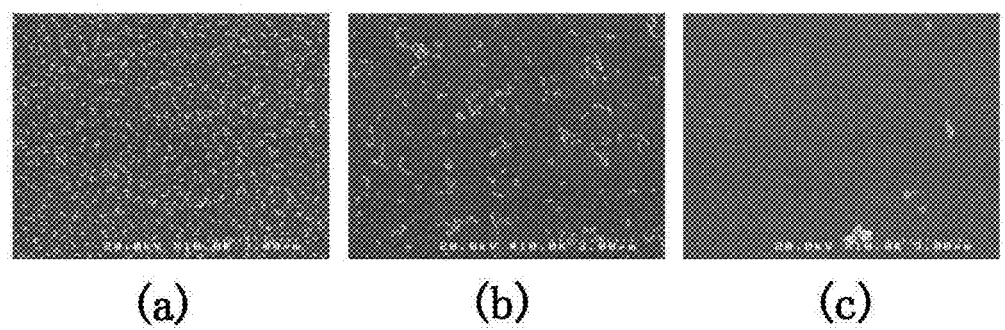
(a)　　　　　　(b)　　　　　　(c)

[FIG. 16]
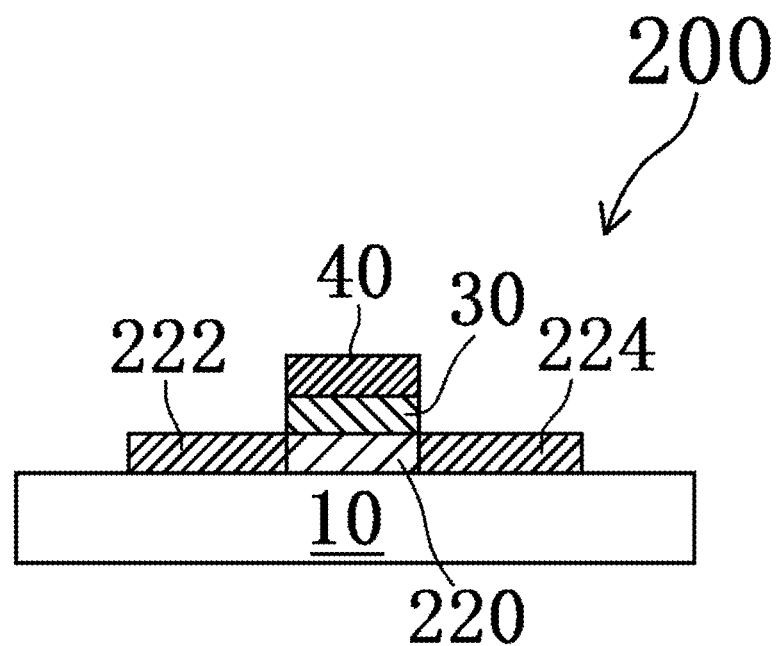

SEMICONDUCTOR DEVICE, METHOD FOR PRODUCING SAME AND ALIPHATIC POLYCARBONATE

TECHNICAL FIELD

The present invention relates to a semiconductor device, a method for producing the same, and an aliphatic polycarbonate.

BACKGROUND ART

Conventionally, a film forming process or an etching process under a vacuum or a low pressure has been predominantly adopted in the production of a thin film transistor as an exemplary semiconductor device. Recently adopted in the production of a thin film transistor is a technique of forming a functional material layer on a substrate under a normal pressure from various solutions as starting materials, instead of the step under a vacuum or a low pressure (Patent Document 1).

PRIOR ART DOCUMENT

Patent Document

Patent Document 1: JP 2013-110175 A

SUMMARY OF THE INVENTION

Problems to be Solved by the Invention

These processes under a vacuum or a low pressure adopted conventionally require a relatively long time period and/or expensive equipment, and thus lead to very low utilization efficiency of raw materials and production energy. This is not preferred from the industrial and mass productivity perspectives. Producing a semiconductor device with use of the technique of forming a functional material layer from various characteristic solutions as starting materials is now attracting considerable attention in the industry from the industrial and mass productivity perspectives. However, further research and development are still required for achievement of an ideal semiconductor device.

Here are typical examples of problems to be solved. The inventors of this application assume that a peripheral circuit of a thin film transistor as an exemplary semiconductor device needs to be integrated in order for further improvement in performance of the thin film transistor. An inverted staggered thin film transistor adopted conventionally has a problem that it becomes harder to disregard parasitic capacitance as the thin film transistor is more integrated. One possible solution to these problems is a thin film transistor having a coplanar structure (i.e. a top gate structure), which is regarded as appropriate for achievement of a self-aligned thin film transistor. What is required for this solution is how to achieve such a self-aligned thin film transistor in accordance with the technique of forming a functional material layer with use of various characteristic solutions.

In a case of adopting the thin film transistor having the coplanar structure, use of a gate electrode as a so-called mask allows self-aligned formation of a source/drain region so as to achieve a self-aligned thin film transistor. However, ion implantation, which has been conventionally adopted for forming a source/drain region, needs to be performed under a vacuum and is not preferred as described above.

Solutions to the Problems

The present invention solves at least one of the problems mentioned above to greatly contribute to provision of a semiconductor device and a method for producing the same, which will easily achieve self-aligned formation of a source/drain region without the processes under a vacuum or a low pressure or expensive equipment. The present invention also greatly contributes to provision of a material that allows formation of such a source/drain region.

The inventors of this application have researched or developed, for formation of a functional material layer with use of a certain solution, a functional material layer formed from various characteristic solutions themselves as starting materials. The inventors of this application have newly found, through intensive and repetitive research and analysis, that a layer formed with use of a specific solution can be utilized for changing or modifying quality of an already formed layer serving as a matrix. The inventors of this application have also found that, even in a case where the matrix is an oxide layer, the layer formed with use of the specific solution can highly reliably be removed after completing its function of changing or modifying the quality of the layer serving as a matrix. The present invention has been devised in accordance with these points.

An exemplary method for producing a semiconductor device according to the present invention includes: an aliphatic polycarbonate layer forming step of forming an aliphatic polycarbonate layer that covers a gate electrode layer disposed above a semiconductor layer with a gate insulator (gate insulating layer) being interposed between the gate electrode layer and the semiconductor layer, and also covers the semiconductor layer, and has a dopant causing the semiconductor layer to become an n-type or p-type semiconductor layer; and a heating step of heating at a temperature causing introduction of the dopant into the semiconductor layer and decomposition of the aliphatic polycarbonate layer.

According to this method for producing the semiconductor device, heating the semiconductor layer serving as a matrix and the aliphatic polycarbonate layer having the dopant enables the dopant to be introduced from the aliphatic polycarbonate layer into the semiconductor layer. Furthermore, the dopant is introduced from the aliphatic polycarbonate layer into the semiconductor layer with the gate electrode layer substantially serving as a mask. It is thus possible to produce a self-aligned semiconductor device (more specifically exemplified by a thin film transistor) with significant reduction in the number of process steps as well as in load. The aliphatic polycarbonate layer itself is decomposed through the heating and is substantially eliminated. There is thus no need to perform additional treatment for removal of a residue, or simple removal of the residue is sufficient. This method for producing the semiconductor device thus achieves change or modification in quality of the semiconductor layer serving as a matrix with excellent dimensional accuracy and with quite ease.

An exemplary semiconductor device according to the present invention includes: a gate electrode layer disposed above a semiconductor layer with a gate insulator being interposed between the gate electrode layer and the semiconductor layer; and a source electrode and a drain electrode formed by introducing a dopant into the semiconductor layer through heating at a temperature causing decomposition of an aliphatic polycarbonate layer that covers the gate electrode layer and the semiconductor layer and has the dopant causing the semiconductor layer to become an n-type or p-type semiconductor layer.

This semiconductor device allows the dopant to be introduced from the aliphatic polycarbonate layer into the semiconductor layer by heating of the semiconductor layer serving as a matrix and the aliphatic polycarbonate layer having the dopant. Furthermore, the dopant is introduced from the aliphatic polycarbonate layer into the semiconductor layer with the gate electrode layer substantially serving as a mask. It is thus possible to achieve a self-aligned semiconductor device (more specifically exemplified by a thin film transistor) with significant reduction in the number of process steps as well as in load. The aliphatic polycarbonate layer itself is decomposed through the heating and is substantially eliminated. There is thus no need to perform additional treatment for removal of a residue, or simple removal of the residue is sufficient. This semiconductor device thus achieves change or modification in quality of the semiconductor layer serving as a matrix with excellent dimensional accuracy and with quite ease.

An exemplary aliphatic polycarbonate according to the present invention covers a gate electrode layer disposed above a semiconductor layer with a gate insulator being interposed between the gate electrode layer and the semiconductor layer, and the semiconductor layer, has a dopant causing the semiconductor layer to become an n-type or p-type semiconductor layer, and serves as a dopant supply source of causing, when heated at a decomposition temperature of the aliphatic polycarbonate, the dopant to be introduced into the semiconductor layer to form a source electrode and a drain electrode of a semiconductor device.

This aliphatic polycarbonate allows the dopant included therein to be introduced into the semiconductor layer when heated at the decomposition temperature of the aliphatic polycarbonate, so as to form the source electrode and the drain electrode of the semiconductor device (more specifically exemplified by a thin film transistor). Furthermore, the dopant is introduced from this aliphatic polycarbonate into the semiconductor layer with the gate electrode layer substantially serving as a mask. It is thus possible to produce a self-aligned semiconductor device with significant reduction in the number of process steps as well as in load. This aliphatic polycarbonate itself serves as a dopant supply source as well as is decomposed through the heating and is substantially eliminated. There is thus no need to perform additional treatment for removal of a residue, or simple removal of the residue is sufficient. This aliphatic polycarbonate thus serves as a useful dopant supply source that enables change or modification in quality of the semiconductor layer serving as a matrix with excellent dimensional accuracy and with quite ease in the formation of the source electrode and the drain electrode of the semiconductor device.

A "substrate" in this application is not limited to a base in a plate shape but includes a base in a different mode. A "layer" in this application conceptually includes a layer as well as a film. Similarly, a "film" in this application conceptually includes a film as well as a layer. A "matrix" in this application includes a substrate as well as a film (or a layer).

Effects of the Invention

In the exemplary method for producing the semiconductor device according to the present invention, the dopant is introduced from the aliphatic polycarbonate layer into the semiconductor layer with the gate electrode layer substantially serving as a mask. It is thus possible to produce the self-aligned semiconductor device. Furthermore, the aliphatic polycarbonate layer itself is decomposed through the heating and is substantially eliminated. It is thus possible to achieve change or modification in quality of the semiconductor layer serving as a matrix with excellent dimensional accuracy and with quite ease.

In the exemplary semiconductor device according to the present invention, the dopant is introduced from the aliphatic polycarbonate layer into the semiconductor layer with the gate electrode layer substantially serving as a mask. It is thus also possible to achieve the self-aligned semiconductor device. Furthermore, the aliphatic polycarbonate layer itself is decomposed through the heating and is substantially eliminated. It is thus possible to achieve the semiconductor device including the semiconductor layer serving as a matrix of which quality is changed or modified with excellent dimensional accuracy and with quite ease.

The exemplary aliphatic polycarbonate according to the present invention allows the dopant included therein to be introduced into the semiconductor layer when heated at the decomposition temperature of the aliphatic polycarbonate, so as to form the source electrode and the drain electrode of the semiconductor device. Furthermore, the dopant is introduced from this aliphatic polycarbonate into the semiconductor layer with the gate electrode layer substantially serving as a mask. It is thus also possible to produce the self-aligned semiconductor device. This aliphatic polycarbonate itself serves as a dopant supply source as well as is decomposed through the heating and is substantially eliminated. The aliphatic polycarbonate thus serves as a useful dopant supply source that enables change or modification in quality of the semiconductor layer serving as a matrix with excellent dimensional accuracy and with quite ease in the formation of the source electrode and the drain electrode of the semiconductor device.

BRIEF DESCRIPTION OF THE DRAWINGS

FIG. 1 is a schematic sectional view of a process in a method for producing a thin film transistor as an exemplary semiconductor device according to a first embodiment of the present invention.

FIG. 2 is a schematic sectional view of a process in the method for producing the thin film transistor as an exemplary semiconductor device according to the first embodiment of the present invention.

FIG. 3 is a schematic sectional view of a process in the method for producing the thin film transistor as an exemplary semiconductor device according to the first embodiment of the present invention.

FIG. 4 is a schematic sectional view of a process in the method for producing the thin film transistor as an exemplary semiconductor device according to the first embodiment of the present invention.

FIG. 5 is a schematic sectional view of a process in the method for producing the thin film transistor as an exemplary semiconductor device according to the first embodiment of the present invention.

FIG. 6 is a schematic sectional view of a process in the method for producing the thin film transistor as an exemplary semiconductor device according to the first embodiment of the present invention.

FIG. 7 is a schematic sectional view of a process in the method for producing the thin film transistor as an exemplary semiconductor device according to the first embodiment of the present invention.

FIG. 8 is a schematic sectional view of a process in the method for producing the thin film transistor as an exemplary semiconductor device according to the first embodiment of the present invention.

FIG. 9 is a graph indicating TG-DTA properties of a PPC solution as a starting material for an aliphatic polycarbonate layer according to the first embodiment of the present invention.

FIG. 10 is a schematic sectional view of an entire structure of the thin film transistor as an exemplary semiconductor device and a process in the method for producing the same according to the first embodiment of the present invention.

FIG. 11 is a graph indicating a measurement result of transfer properties of the thin film transistor as an exemplary semiconductor device according to the first embodiment of the present invention.

FIG. 12 is a graph indicating a relation between a concentration of impurities (tin acetylacetonate) in a PPC solution containing impurities and a sheet resistance value of a semiconductor layer serving as a matrix in the first embodiment of the present invention.

FIG. 13 is a graph indicating a relation between a period of heating, at a predetermined temperature, a layer made of a PPC solution containing impurities (tin acetylacetonate) having a certain concentration (10 wt %) and the sheet resistance value of the semiconductor layer serving as a matrix in the first embodiment of the present invention.

FIG. 14 is a graph indicating a relation between the period (minute) of heating, at a predetermined temperature, a layer made of a PPC solution containing impurities (tin acetylacetonate) having a low concentration (1.4 wt %) and the sheet resistance value (Ω/square) of the semiconductor layer serving as a matrix in the first embodiment of the present invention.

FIGS. 15(a) to 15(c) are scanning electron microscope (SEM) photographs in a planar view of a residue observed after heating of the layer made of the PPC solution containing impurities having a certain concentration in the first embodiment of the present invention.

FIG. 16 is a schematic sectional view of an entire structure of a thin film transistor as an exemplary semiconductor device according to a different embodiment of the present invention.

EMBODIMENTS OF THE INVENTION

Thin film transistors as exemplary semiconductor devices and methods for producing the same according to the embodiments of the present invention will now be described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the drawings.

First Embodiment

1. Method for Producing Thin Film Transistor and Entire Structure of Thin Film Transistor According to the Present Embodiment FIGS. 1 to 8 are schematic sectional views of processes in a method for producing a thin film transistor 100 as an exemplary semiconductor device. FIG. 10 is a schematic sectional view of a process in the method for producing the thin film transistor 100 according to the present embodiment and an entire structure of the thin film transistor 100. The thin film transistor 100 has a coplanar structure (i.e. a top gate structure) in the present embodiment. FIG. 11 is a graph indicating transfer properties of the thin film transistor 100 according to the present embodiment.

As depicted in FIG. 10, the thin film transistor 100 according to the present embodiment includes a substrate 10, as well as a source electrode 22, a drain electrode 24, and a semiconductor layer 20 serving as a channel, which are formed at the same layer level on the substrate 10. The semiconductor layer 20 is provided thereon with a gate insulator 30 and a gate electrode layer 40, which are stacked from the lower side in the mentioned order. A person skilled in the art comprehending the thin film transistor 100 according to the present embodiment will fully comprehend provision or achievement of an electronic device including the thin film transistor 100 (e.g. a mobile terminal, an information appliance, or any other known electric appliance) with no particular description. A temperature indicated in this application is a preset temperature of a heater or a stage to be in contact with the substrate 10. Patterning of an extraction electrode from each electrode is not depicted in order for simplification of the drawings.

The substrate 10 according to the present embodiment is not particularly limited, and is a substrate generally included in a semiconductor device. The substrate 10 can be made of various insulating base materials including semiconductor substrates (e.g. a Si substrate, a SiC substrate, and a Ge substrate) such as highly heat resistant glass, a $SiO_2$/Si substrate (i.e. a silicon substrate provided thereon with a silicon oxide film), an alumina ($Al_2O_3$) substrate, an STO (SrTiO) substrate, and an insulating substrate obtained by forming an STO (SrTiO) layer on a surface of a Si substrate with a Sift layer and a Ti layer being interposed therebetween. Examples of the insulating substrate include films and sheets made of materials such as polyesters including polyethylene terephthalate and polyethylene naphthalate, polyolefins, cellulose triacetate, polycarbonate, polyamide, polyimide, polyamide imide, polysulfone, aramid, and aromatic polyamide. The substrate is not particularly limited in terms of its thickness, which can be 3 μm or more and 1.1 mm or less. The substrate may be hard or flexible.

(1) Formation of Semiconductor Layer (Channel)

The channel according to the present embodiment is typically exemplified by a metal oxide layer (also referred to as a "first material layer") possibly serving as a semiconductor. More specifically, the first material layer according to the present embodiment is an oxide (possibly including inevitable impurities) containing indium (In), zinc (Zn), and zirconium (Zr) having an atomic ratio of 0.05 with respect to indium (In) assumed to have an atomic ratio of 1 (hereinafter, also referred to as a "$ZrInZnO_x$ layer"). Such a metal oxide possibly serving as a semiconductor is referred to as a "first material" in the present embodiment.

The $ZrInZnO_x$ layer is adopted as the semiconductor layer 20 in the present embodiment particularly for achievement of various improved properties as a thin film transistor (e.g. hysteresis reduction or an ON/OFF ratio).

As depicted in FIG. 1, the substrate 10 according to the present embodiment is provided thereon with a precursor layer 20a made of the first material as a compound of a metal (also referred to as a "metal compound") to be oxidized into a semiconductor dispersed in a solution (hereinafter, also referred to as the "first material precursor layer" or the "precursor layer"). The first material precursor layer 20a is then subjected to preliminary annealing of heating at 150° C. for a predetermined period (e.g. 5 minutes) in the atmosphere. This preliminary annealing evaporates or decomposes a solvent component almost entirely to eliminate the solvent component.

The first material precursor layer 20a is subjected to imprinting after the preliminary annealing. Specifically, as depicted in FIG. 2, the first material precursor layer 20a is subjected to imprinting with use of a precursor layer mold M1 with a pressure of 0.1 MPa or more and 20 MPa or less (typically 10 MPa) while the first material precursor layer 20a is being heated to a temperature in the range from 100° C. or more to 200° C. or less (typically 150° C.). As depicted in FIG. 3, the first material precursor layer 20a thus has an imprinted structure.

The entire precursor layer 20a according to the present embodiment is subsequently dry etched from a surface thereof by plasma irradiation under the atmospheric pressure. Alternatively, the precursor layer 20a is wet etched with use of a known or commercially available acid solution (e.g. an acid solution having same components as an indium tin oxide (ITO) etching solution). As depicted in FIG. 4, the precursor layer 20a is thus removed in a region provided with no pattern (removal target region) whereas the precursor layer 20a in a region to be provided with a pattern has thickness of at least a certain value to eventually be provided with the pattern. It is noted that, as in the present embodiment, pattern formation with quite wide dimensional flexibility from several tens of nanometers to several hundred micrometers or the like as well as with high dimensional accuracy is achieved even under the atmospheric pressure.

The first material precursor layer 20a is then heated, for example, at 500° C. for a predetermined period in an oxygen atmosphere, in the atmosphere, or the like for main annealing in an "annealing step". As depicted in FIG. 5, the substrate 10 is thus provided thereon with the semiconductor layer (first material layer) 20 made of the first material. The semiconductor layer 20 after the main annealing is eventually about 40 nm in typical thickness.

Examples of a precursor containing indium (In) for the first material layer serving as the semiconductor layer 20 according to the present embodiment include indium acetylacetonate. Other examples include indium acetate, indium nitrate, indium chloride, and any indium alkoxide (e.g. indium isopropoxide, indium butoxide, indium ethoxide, or indium methoxyethoxide). Examples of a precursor containing zinc (Zn) for the first material layer serving as the semiconductor layer 20 according to the present embodiment include zinc chloride. Other examples include zinc nitrate, zinc acetate, and any zinc alkoxide (e.g. zinc isopropoxide, zinc butoxide, zinc ethoxide, or zinc methoxyethoxide). Examples of a precursor containing zirconium (Zr) for the first material layer serving as the semiconductor layer 20 according to the present embodiment include zirconium butoxide. Other examples include zirconium nitrate, zirconium chloride, and any other zirconium alkoxide (e.g. zirconium isopropoxide, zirconium butoxide, zirconium ethoxide, or zirconium methoxyethoxide).

The first material layer serving as a semiconductor layer is not particularly limited in terms of its phase state. For example, the first material layer may be in any one of a crystal form, a polycrystal form, and an amorphous form. The present embodiment can also cover a phase state where a grown crystal has a branch form or a scale form.

The precursor layer having high plastic deformability is subjected to imprinting in the present embodiment. Accordingly, even if the imprinting is performed with such a low pressure in the range from 0.1 MPa or more to 20 MPa or less, each precursor layer is deformed so as to follow the shape of the surface of the mold. It is thus possible to highly accurately form a desired imprinted structure. The pressure is set in such a low range from 0.1 MPa or more to 20 MPa or less, so that the mold is less likely to be damaged during the imprinting and increase in area will also be achieved advantageously.

The pressure is set within the range "from 0.1 MPa or more to 20 MPa or less" for the following reasons. If the pressure is less than 0.1 MPa, the precursor layer may not be subjected to imprinting with such a low pressure. If the pressure is as large as 20 MPa, the precursor layer can be subjected to imprinting sufficiently and no more pressure needs to be applied thereto.

(2) Formation of Gate Insulator and Gate Electrode Layer

In the thin film transistor 100 according to the present embodiment, the gate insulator 30 is made of silicon oxide (possibly including inevitable impurities; this applies hereinafter to an oxide of this material as well as an oxide of any other material) obtained from, as a starting material, a gate insulator precursor solution containing a precursor containing silicon (Si) (e.g. polysilazane) as a solute.

In the present embodiment, a gate insulator precursor layer is formed by applying the gate insulator precursor solution onto the semiconductor layer 20 in accordance with a spin coating method or the like. The gate insulator precursor layer is then subjected to the annealing step of heating, for example, at 440° C. for a predetermined period (e.g. 2 hours) in the atmosphere, for example. The semiconductor layer 20 is thus provided thereon with the gate insulator 30. The gate insulator 30 according to the present embodiment can be about 120 nm thick. As depicted in FIG. 6, the gate electrode layer 40 made of platinum (Pt) is then formed in accordance with a sputtering technique and a photolithography technique which are known to the public. The gate electrode layer 40 according to the present embodiment can be about 130 nm thick.

The gate insulator 30 is subsequently etched by plasma of carbon tetrafluoride ($CF_4$) with use of a known reactive ion etching (RIE) device, with the gate electrode layer 40 substantially serving as a mask. As depicted in FIG. 7, the substrate 10 is thus provided thereon with a structure including the semiconductor layer 20, the gate insulator 30, and the gate electrode layer 40 stacked in the mentioned order.

The material for the gate electrode layer 40 according to the present embodiment is not limited to platinum. The gate electrode layer 40 can be made of a high melting metal such as platinum, gold, silver, copper, aluminum, molybdenum, palladium, ruthenium, iridium, or tungsten, a metal material such as an alloy thereof, a conductive metal oxide including ruthenium oxide, a $p^+$-silicon layer, or an $n^+$-silicon layer.

The present embodiment is not particularly limited in terms of a method for applying the gate insulator precursor solution. For example, it is possible to adopt, instead of the spin coating method, a printing method such as gravure printing, screen printing, offset printing, or ink jet printing, or a coating method such as roll coating, die coating, air knife coating, blade coating, reverse coating, or gravure coating. In particular, according to a preferred aspect, the gate insulator precursor solution is applied to the substrate 10 in accordance with a simple method such as the spin coating method or the screen printing method.

(3) Production of Aliphatic Polycarbonate

Described below is a method for producing polypropylene carbonate (PPC) as a typical example of the aliphatic polycarbonate according to the present embodiment.

First, an organozinc catalyst is produced as a metal catalyst. Specifically, a four-necked flask having the volume of 300 mL and equipped with a stirrer, a nitrogen gas introduction tube, a thermometer, and a reflux condenser was charged with 8.1 g (100 mmol) of zinc oxide, 12.7 g (96 mmol) of glutaric acid, 0.1 g (2 mmol) of acetic acid, and 130 g (150 mL) of toluene. After the atmosphere in a reaction system was replaced with nitrogen, the temperature of the flask was raised to 55° C. and the materials were stirred at this temperature for 4 hours so as to cause reaction of the materials. The temperature of the flask was then raised to 110° C. and the materials were stirred at this temperature for 4 hours so as to cause azeotropic dehydration for removal of only water. The flask was then cooled to room temperature so as to obtain a reaction solution containing an organozinc catalyst.

The organozinc catalyst, which was obtained by partially fractionating and filtrating the reaction solution, was subjected to IR measurement (an apparatus manufactured by Thermo Nicolet Japan Inc., trade name: AVATAR360). There was found no peak caused by carboxylic groups.

Subsequently, the atmosphere in a system of an autoclave having the volume of 1 L and equipped with a stirrer, a gas introduction tube, and a thermometer was preliminarily replaced with nitrogen, and the autoclave was then charged with 8.0 mL of the reaction solution containing the organozinc catalyst (containing 1.0 g of the organozinc catalyst), 131 g (200 mL) of hexane, and 46.5 g (0.80 mol) of propylene oxide. The atmosphere in the reaction system was then replaced with carbon dioxide by adding carbon dioxide with stirring, and the autoclave was filled with carbon dioxide until the pressure in the reaction system reached 1.5 MPa. The temperature of the autoclave was subsequently raised to 60° C. and polymerization reaction was carried out for 6 hours while supplying carbon dioxide to be consumed by the reaction.

The autoclave was cooled and depressurized and its content was filtrated after the reaction was completed. A filtrated product was then dried under a reduced pressure to obtain 80.8 g of PPC (possibly including inevitable impurities; this applies hereinafter).

The obtained PPC had the following physical properties and could thus be identified from the physical properties.

absorption peaks of IR (KBr): 1742, 1456, 1381, 1229, 1069, and 787 (each by the unit of $cm^{-1}$)

The obtained PPC had a number average molecular weight of 52000.

The aliphatic polycarbonate mentioned above has the number average molecular weight of 52000, but the number average molecular weight is not limited to this value. An aliphatic polycarbonate having a number average molecular weight from 5000 to 1000000 is preferably used herein. A more preferred number average molecular weight is in the range from 10000 to 500000. A solution of the aliphatic polycarbonate having a number average molecular weight of less than 5000 will have problems of low viscosity, difficult handling, and low dimensional flexibility of the aliphatic polycarbonate having been patterned. Furthermore, the solution of the aliphatic polycarbonate having a number average molecular weight exceeding 1000000 will have problems of high viscosity, difficult handling, and low dimensional accuracy of the aliphatic polycarbonate having been patterned.

[Method for Measuring Number Average Molecular Weight of Aliphatic Polycarbonate]

The number average molecular weight of the aliphatic polycarbonate was calculated in the following manner.

Specifically, a chloroform solution containing the aliphatic polycarbonate having a concentration of 0.5% by mass was prepared and measured with use of high performance liquid chromatography. After the measurement, the molecular weight was calculated by comparison with polystyrene having an already known number average molecular weight measured under identical conditions. The measurement was performed under the following conditions.

Type: HLC-8020 (Manufactured by Tosoh Corporation)
Column: GPC column
(Trade name of Tosoh Corporation: TSK GEL Multipore HXL-M)
Column temperature: 40° C.
Eluate: chloroform
Flow speed: 1 mL/minute (4) Formation of Aliphatic Polycarbonate Layer As depicted in FIG. 8, after (2) "formation of gate insulator and gate electrode layer" described above, an aliphatic polycarbonate layer 50, that covers the semiconductor layer 20 and the gate electrode layer 40 disposed above the semiconductor layer 20 with the gate insulator being interposed between the gate electrode layer 40 and the semiconductor layer 20, is formed in accordance with the spin coating method in the present embodiment. More specifically, the method for forming the aliphatic polycarbonate layer 50 according to the present embodiment is described below.

First, a PPC solution containing impurities was produced by dispersing a solution obtained by dissolving tin acetylacetonate in propionic acid (hereinafter, also referred to as an "Sn solution") in a solution of polypropylene carbonate (hereinafter, also referred to as a "PPC solution"). The PPC as a solute in the PPC solution according to the present embodiment has a concentration of 6% by mass. The PPC solution according to the present embodiment contains diethylene-glycol-monoethyl-ether-acetate as a solvent.

The aliphatic polycarbonate layer 50 is then formed from the PPC solution containing impurities as a starting material in accordance with the spin coating method as described above. In the present embodiment, the aliphatic polycarbonate layer 50 was formed through a drying step of drying, at about 180° C., a coating film formed in accordance with the spin coating method.

The organic solvent adopted as the PPC solution according to the present embodiment is not particularly limited if the organic solvent dissolves an aliphatic polycarbonate. Specific examples of the organic solvent include, in addition to diethylene-glycol-monoethyl-ether-acetate mentioned above, α-terpineol, β-terpineol, N-methyl-2-pyrrolidone, isopropyl alcohol, diethylene glycol monobutyl ether acetate, diethylene glycol monobutyl ether, toluene, cyclohexane, methyl ethyl ketone, dimethyl carbonate, diethyl carbonate, and propylene carbonate. Diethylene glycol monoethyl ether acetate, α-terpineol, N-methyl-2-pyrrolidone, and propylene carbonate among these organic solvents are preferably used because each of these organic solvents has an appropriately high boiling point, less evaporates at room temperature, and can be uniformly removed during annealing of an oxide semiconductor precursor to be obtained.

The present embodiment is not particularly limited in terms of methods for producing the metal compound and the PPC solution containing impurities. According to an adoptable aspect, the precursor is obtained by stirring the Sn solution and the PPC solution in accordance with a conventionally known stirring method.

Examples of the known stirring method include mixing with use of a stirrer, and kneading and mixing by rotation and/or vibration with use of a device such as a mill filled with ceramic balls.

In order for improvement in dispersibility of tin acetylacetonate, a dispersant, a plasticizer, or the like can further be added to the PPC solution containing impurities where desired.

Specific examples of the dispersant include:

polyhydric alcohol esters such as glycerol and sorbitan;

polyetherpolyols such as diethylene glycol, triethylene glycol, dipropylene glycol, tripropylene glycol, polyethylene glycol, and polypropylene glycol; amines such as polyethyleneimine;

(meth)acrylic resins such as polyacrylic acid and polymethacrylic acid; and copolymers of isobutylene or styrene and maleic anhydride, and amine salts thereof.

Specific examples of the plasticizer include polyetherpolyols and phthalate esters.

(5) Introduction of Dopant into Semiconductor Layer

The aliphatic polycarbonate layer 50 and the stacked structure of the semiconductor layer 20, the gate insulator 30, and the gate electrode layer 40 are subsequently heated at about 400° C. for 20 minutes. Tin (Sn) contained in tin acetylacetonate in the PPC solution containing impurities is thus diffused to be introduced into the semiconductor layer 20. Furthermore, polypropylene carbonate (PPC) as a main material for the aliphatic polycarbonate layer 50 is decomposed through the heat treatment and is substantially eliminated.

[TG-DTA (Thermogravimetry and Differential Heat) Properties Evaluation of PPC]

TG-DTA properties indicated in FIG. 9 also support the fact that the aliphatic polycarbonate layer 50 is substantially eliminated or removed in a process of introducing the dopant into the semiconductor layer 20. Polypropylene carbonate as the main material for the aliphatic polycarbonate layer 50 according to the present embodiment is an aliphatic polycarbonate of an endothermic decomposition type with excellent thermal decomposition properties. Such an aliphatic polycarbonate has a high oxygen content and can be decomposed into a low molecular weight compound at a relatively low temperature. The aliphatic polycarbonate thus positively contributes to reduction in amount of remaining impurities such as carbon impurities after the heat treatment in the process of introducing the dopant into the semiconductor layer 20.

FIG. 9 is a graph indicating the TG-DTA properties of the PPC solution as a starting material for the aliphatic polycarbonate layer 50 according to the present embodiment. The solid line in FIG. 9 indicates a thermogravimetry (TG) result whereas the dotted line in this graph indicates a differential heat (DTA) measurement result.

As found from the thermogravimetry result indicated in FIG. 9, there is significant reduction in weight in the range from around 140° C. to around 190° C., due to elimination of the solvent of the PPC solution as well as partial decomposition or elimination of PPC itself. As found from the result indicated in FIG. 9, 90 wt % or more of PPC is decomposed and eliminated at around 190° C. PPC is assumed to be decomposed into carbon dioxide and water by this decomposition. More specifically, it is found that 95 wt % or more of PPC is decomposed at around 250° C. and almost all (99 wt % or more) of PPC is decomposed at around 260° C. The aliphatic polycarbonate layer 50 is thus to be substantially eliminated by being heat treated at 260° C. or more (more preferably at 300° C. or more) in the process of introducing the dopant into the semiconductor layer 20. The aliphatic polycarbonate layer 50 itself is decomposed through the heat treatment and is substantially eliminated. It is thus significantly effective that there is no need to perform additional treatment for removal of a residue, or simple removal of the residue is sufficient.

The heat treatment in the process of introducing the dopant into the semiconductor layer 20 is performed in a nitrogen atmosphere. However, the atmosphere of the heat treatment is not limited to a nitrogen atmosphere. According to an adoptable aspect, the heat treatment is performed in an oxygen atmosphere or in the atmosphere.

(6) Formation of Thin Film Transistor

As depicted in FIG. 10, the thin film transistor 100, that includes the source electrode 22 and the drain electrode 24 provided partially in the region of the first material layer serving as the semiconductor layer 20, is formed through the heat treatment in the process of introducing the dopant into the semiconductor layer. The dopant is introduced from the aliphatic polycarbonate layer 50 into the semiconductor layer 20 with the gate electrode layer 40 substantially serving as a mask in the present embodiment. Production of a self-aligned thin film transistor is thus achieved possibly with significant reduction in the number of process steps as well as in load. The method for producing the thin film transistor 100 according to the present embodiment thus achieves change or modification in quality of the semiconductor layer 20 serving as a matrix with excellent dimensional accuracy and with quite ease.

Although not depicted, according to an adoptable aspect, there is additionally provided a passivation layer that covers the source electrode 22 and the drain electrode 24 of the thin film transistor 100.

Neither the heating steps nor the drying step described above is particularly limited in terms of its heating method. The heating method can be exemplified by a conventional heating method with use of a thermostat, an electric furnace, or the like. Particularly in a case where a substrate (e.g. the substrate 10; this applies hereinafter) is less heat-resistant, according to a preferred aspect, adopted is a method for heating only the heating target layer by means of ultraviolet rays, electromagnetic waves, or a lamp for prevention of heat transfer to the substrate.

For example, in a case where heating by means of ultraviolet rays (UV) is adopted along with heating the substrate in the heating step of heating at a temperature causing introduction of the dopant into the semiconductor layer 20 and decomposition of the aliphatic polycarbonate layer 50, it is possible to perform heat treatment only by means of irradiation with ultraviolet rays (UV) as well as irradiation with ultraviolet rays (UV) in an ozone ($O_3$) atmosphere.

The aliphatic polycarbonate layer 50 is substantially eliminated by being irradiated with ultraviolet rays (UV) in an ozone ($O_3$) atmosphere, even at a temperature lower by about several tens of degrees (e.g. 200° C. to 240° C.) than a substrate heating temperature (e.g. 260° C. to 300° C.) of a case of not irradiating with ultraviolet rays (UV) in an ozone ($O_3$) atmosphere. Furthermore, irradiation with ultraviolet rays (UV) in an ozone ($O_3$) atmosphere will shorten a period of the heat treatment to the substrate (including the period of irradiating with ultraviolet rays (UV)). It is noted that adoption of the step of irradiating the aliphatic polycarbonate layer 50 with ultraviolet rays (UV) in an ozone (O₃) atmosphere achieves removal of the aliphatic polycarbonate layer 50 through such a process at a lower temperature for a shorter period.

[Electrical Properties of Thin Film Transistor]

Electrical properties of the thin film transistor 100 were measured. FIG. 11 is a graph indicating a measurement result of the transfer properties of the thin film transistor 100. In FIG. 11, an abscissa axis indicates voltage (Vg) applied to the gate electrode and an ordinate axis indicates a drain current value (Id).

As indicated in FIG. 11, the thin film transistor 100 was found to have sufficient electrical properties as a transistor. Specifically, as indicated in Table 1, there was found a case where electric field effect mobility was 20 cm²/V·s or more. There was also found a case where an SS value was about 0.2 V/decade and the ON/OFF ratio of the current value had a value of seven or more digits. It is thus clarified that the present embodiment will achieve sufficient electrical properties as a transistor by changing or modifying the quality of the semiconductor layer 20 of the thin film transistor 100 with no need for a step under a vacuum or a low pressure.

TABLE 1

|  | SS (V/dec.) | $\mu_{FE}$ (cm²/Vs) | ON/OFF |
|---|---|---|---|
| Electrical properties of thin film transistor 100 | About 0.2 | ≥20 | ≥10⁷ |

[Analysis on Introduction of Dopant into Semiconductor Layer]

A detailed mechanism of introduction of the dopant (in the present embodiment, tin) from the aliphatic polycarbonate layer 50 into the semiconductor layer 20 is unknown at the time of filing of this application. However, the inventors of this application have found, through research and analysis, the following facts of great interest.

FIG. 12 is a graph indicating a relation between a concentration (wt %) of the impurities in the PPC solution containing impurities (tin acetylacetonate (indicated as "Sn (acac)" in the graph) in the present embodiment) and a sheet resistance value (Ω/square) of the semiconductor layer serving as a matrix in the present embodiment. Adopted in this case was a method similar to the method for forming the source electrode 22 and the drain electrode 24 in the present embodiment, except that the heating temperature was 400° C. and the heating period was 10 minutes in this measurement. FIG. 12 indicates ZrInZnO$_x$ itself in a case where a tin acetylacetonate content is zero. Found in this measurement was an effect of introducing the dopant into the semiconductor layer 20 by varying the concentration of tin acetylacetonate in the PPC solution containing impurities.

As indicated in FIG. 12, it was found that the sheet resistance value of the semiconductor layer 20 decreased significantly if the tin acetylacetonate content in the PPC solution containing impurities was 1 wt % or more. It is noted that the sheet resistance value was decreased by about five digits when the tin acetylacetonate content was 2 wt % or more.

FIG. 13 is a graph indicating a relation between a period (minute) of heating, at a predetermined temperature, a layer made of the PPC solution containing impurities (tin acetylacetonate in the present embodiment) having a certain concentration and the sheet resistance value (Ω/square) of the semiconductor layer serving as a matrix in the present embodiment. The heating temperature is 400° C. in this measurement. Tin acetylacetonate had a concentration of 10 wt % in this measurement. Adopted in this case was a method similar to the method for forming the source electrode 22 and the drain electrode 24 in the present embodiment, except for the above conditions.

As indicated in FIG. 13, it was found that heat treatment for 10 minutes decreases the sheet resistance value to about 7900 (Ω/square). It was additionally found that the sheet resistance value decreases as the heat treatment period is longer. In terms of reduction in production period, the heat treatment period in the process of introducing the dopant into the semiconductor layer 20 is preferably 10 minutes or more and 90 minutes or less.

The inventors of this application also analyzed a layer made of a PPC solution containing a low concentration (1.4 wt %) of impurities (tin acetylacetonate). FIG. 14 is a graph indicating a relation between a period (minute) of heating, at a predetermined temperature, a layer made of a PPC solution containing impurities (tin acetylacetonate) having the low concentration (1.4 wt %) and the sheet resistance value (Ω/square) of the semiconductor layer serving as a matrix in the present embodiment. As indicated in FIG. 14, it was found that heat treatment for only 10 minutes decreased the sheet resistance value to 6×10⁵ (Ω/square) even in the case of adopting the PPC solution containing impurities (tin acetylacetonate) having such a low concentration of 1.4 wt %. It is also noted that heat treatment for 90 minutes decreases the sheet resistance value to about 1.5×10⁵ (Ω/square). It was also interestingly found that the sheet resistance value is not decreased by heating for over 90 minutes. As described above, heat treatment for over 90 minutes hardly has technical significance.

It is found from the above results that the sheet resistance value will be effectively decreased if the content of impurities (tin acetylacetonate in the present embodiment) in the PPC solution containing impurities is 1.4 wt % or more. In contrast, in terms of decrease in sheet resistance value, the PPC solution containing impurities can contain tin acetylacetonate having a content exceeding 20 wt %. There is no large variation in the numerical range from 5 wt % or more as indicated in FIG. 12. It will thus be hardly useful that tin acetylacetonate in the PPC solution containing impurities has a content exceeding 20 wt %.

The inventors of this application found, through research and analysis, another fact of great interest. When introduction of the dopant (tin) was intended with use of a layer made only of the Sn solution as a starting material in place of the aliphatic polycarbonate layer 50 made of the PPC solution containing impurities as a starting material in the process of introducing the dopant into the semiconductor layer 20, it was found that the semiconductor layer 20 was provided on the surface with a layer consisting essentially of tin oxide (SnOx) or a residue in an island shape (hereinafter, also representatively referred to as a "tin oxide layer").

FIGS. 15(*a*) to 15(*c*) are scanning electron microscope (SEM) photographs in a planar view of a residue observed after heating, at 400° C., of the layer made of the PPC solution containing impurities (tin acetylacetonate in the present embodiment) having a certain concentration in the present embodiment. FIG. 15(*a*) indicates a result of heat treating a layer made of a PPC solution containing impurities having a concentration of 10 wt %. FIG. 15(*b*) indicates a result of heat treating a layer made of a PPC solution containing impurities having a concentration of 5 wt %. FIG. 15(*c*) indicates a result of heat treating a layer made of a PPC solution containing impurities having a concentration of 1.4 wt %. As indicated in FIGS. 15(*a*) to 15(*c*), as the concentration is lower, the tin oxide (SnOx) layer or a residue in an island shape (hereinafter, also representatively referred to as the "tin oxide layer") was found to be smaller in the number.

In terms of reduction of a residue, it is preferred to heat treat a layer made of a PPC solution containing impurities having a concentration of 5 wt % or less. It was found through further research and analysis that the tin oxide layer can easily be removed by applying ultrasonic waves to the tin oxide layer as a residue immersed in water at least in a case of heat treating a layer made of a PPC solution containing impurities having a concentration of 2 wt % or less. It is thus a more preferred aspect that the concentration is 2 wt % or less in terms of easy removal of a residue. According to a particularly preferred aspect, the concentration is 1.4 wt % or less in terms the above point. By summarizing the above results, according to a preferred aspect, an amount of impurities as a dopant is 0.1 mol or less with respect to 1 kg of PPC as an example of an aliphatic polycarbonate in a PPC solution containing impurities in terms of easy removal of a residue. As already mentioned, also in terms of decrease in sheet resistance value of the semiconductor layer 20, the content of tin acetylacetonate as a dopant is preferably 1 wt % or more, i.e. the amount of the impurities as a dopant is preferably 0.05 mol or more. The preferred numerical range of the number of moles of the impurities is also applicable to impurities other than tin acetylacetonate.

Further increase of the residue occasionally causes a short circuit between the source electrode 22 and the drain electrode 24. In the case of adopting the layer made only of the Sn solution as a starting material, there is additionally required a step of removing the tin oxide layer after the source electrode 22 and the drain electrode 24 are formed. In the other case of adopting the aliphatic polycarbonate layer 50, the aliphatic polycarbonate layer 50 is decomposed through the heat treatment and is substantially eliminated in the process of introducing the dopant into the semiconductor layer 20. The eliminating effect is significant particularly in the case of adopting impurities having a low concentration. It would be because part of tin (Sn) in the aliphatic polycarbonate layer 50 is evaporated and part of the remaining tin is introduced as a dopant into the semiconductor layer 20. Adoption of the aliphatic polycarbonate layer 50 according to the present embodiment has technical significance that no additional treatment is required for removal of a residue (e.g. the tin oxide layer or a residue in an island shape), or simple removal of the residue is sufficient.

The inventors of this application further investigated to find that the sheet resistance value of the semiconductor layer 20 can be considerably decreased even in a case where the heat treatment temperature is lower than 400° C. in the process of introducing the dopant into the semiconductor layer 20. It was found that generation of the residue was prevented and the sheet resistance value was decreased to 2 Ω/square or less by heat treatment at 300° C., for example. The heat treatment at 300° C. or more will thus achieve at least part of the effects of the thin film transistor 100 according to the present embodiment.

The first material layer according to the present embodiment is the oxide layer consisting essentially of oxygen (O) and zinc (Zn), indium (In), and zirconium (Zr). However, the first material layer according to the present embodiment is not limited to this oxide layer. For example, effects similar to or at least part of the effects of the present embodiment will be exerted even in a case where the first material layer is an oxide layer consisting essentially of oxygen (O) and one, two, or more metals selected from the group consisting of indium (In), tin (Sn), zinc (Zn), cadmium (Cd), zirconium (Zr), gallium (Ga), antimony (Sb), and copper (Cu), other than the oxide mentioned above. Furthermore, effects similar to or at least part of the effects of the present embodiment will be exerted even in a case where the first material layer is made of a substance selected from the group consisting of silicon (Si) and a silicon compound (represented by SiC or SiGe).

The dopant according to the present embodiment is tin (Sn) possibly serving as an n-type dopant. However, the dopant of the present embodiment is not limited to this element. Specifically, the dopant is not particularly limited in terms of its element if the dopant will serve as an n-type dopant for the first material layer. According to an adoptable aspect, one, two, or more elements selected from the group consisting of tin (Sn), fluorine (F), antimony (Sb), indium (In), gallium (Ga), phosphorus (P), arsenic (As), and aluminum (Al) serve as an n-type dopant for the first material layer.

Different Embodiment 1

The first material layer is adopted as the semiconductor layer in the first embodiment. However, the first embodiment is not limited to various first materials. According to a different preferred aspect, a thin film transistor 200 includes a second material layer serving as a semiconductor layer 220 to be described below in place of the first material layer, as depicted in FIG. 16. Specifically, effects similar to or at least part of the effects of the thin film transistor 100 according to the first embodiment will be exerted by combining with the following dopant even in a case where the second material layer 220 is an oxide layer consisting essentially of oxygen (O) and one, two, or more metals selected from the group consisting of copper (Cu), aluminum (Al), gallium (Ga), strontium (Sr), lanthanum (La), selenium (Se), zinc (Zn), zirconium (Zr), and antimony (Sb) or a sulfide layer consisting essentially of sulfur (S) and one, two, or more metals selected from the group consisting of copper (Cu), aluminum (Al), gallium (Ga), strontium (Sr), lanthanum (La), selenium (Se), zinc (Zn), zirconium (Zr), and antimony (Sb). Furthermore, effects similar to or at least part of the effects of the thin film transistor 100 according to the first embodiment will be exerted by combining with the following dopant even in a case where the second material layer 220 is made of a substance selected from the group consisting of silicon (Si) and a silicon compound (represented by SiC or SiGe).

The dopant for the second material layer 220 is exemplified below. The dopant is not particularly limited in terms of its element if the dopant will serve as a p-type dopant for the second material layer 220. According to an adoptable aspect, one, two, or more elements selected from the group consisting of tin (Sn), fluorine (F), antimony (Sb), indium (In), gallium (Ga), aluminum (Al), boron (B), and magnesium (Mg) serve as a p-type dopant for the second material layer 220. Electrical properties similar to those of the thin film transistor 100 according to the first embodiment will be achieved by adopting a source electrode 222 and a drain electrode 224 formed by introducing the p-type dopant.

Different Embodiment 2

The aliphatic polycarbonate according to the first embodiment is not particularly limited in terms of its type. According to a preferably adoptable aspect of the present embodiment, an aliphatic polycarbonate obtained by polymerization reaction between an epoxide and carbon dioxide is used. Adoption of such an aliphatic polycarbonate obtained by polymerization reaction between an epoxide and carbon dioxide effectively achieves a desired molecular weight enabling improvement in endothermic decomposition property by control of the structure of the aliphatic polycarbonate. The aliphatic polycarbonate is preferably of at least one type selected from the group consisting of polyethylene carbonate and polypropylene carbonate in terms of a high oxygen content and decomposition into a low molecular weight compound at a relatively low temperature.

The epoxide is not particularly limited if the epoxide undergoes polymerization reaction with carbon dioxide to form an aliphatic polycarbonate having a structure including aliphatic groups on the main chain. Adoptable examples of the epoxide according to the present embodiment include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinylcyclohexene oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, and 3-trimethylsilyloxypropylene oxide. Among these epoxides, ethylene oxide and propylene oxide are preferably used in terms of high polymerization reactivity with carbon dioxide. These epoxides may each be used singly or may be used in combinations of two or more thereof.

The aliphatic polycarbonate mentioned above has a number average molecular weight of preferably from 5000 to 1000000 and more preferably from 10000 to 500000. The aliphatic polycarbonate having a number average molecular weight of less than 5000 exerts insufficient effects as a binder and may cause cracks in the semiconductor layer or deterioration in adhesion between the substrate and the semiconductor layer. The aliphatic polycarbonate having a number average molecular weight of more than 1000000 may be hard to be handled due to lower dissolubility of the aliphatic polycarbonate in an organic solvent. The numerical value of the number average molecular weight is measured in accordance with the "method for measuring number average molecular weight of aliphatic polycarbonate" described earlier.

The aliphatic polycarbonate mentioned above can be exemplarily produced by polymerization reaction between the epoxide and carbon dioxide in the presence of a metal catalyst.

Specific examples of the metal catalyst include an aluminum catalyst and a zinc catalyst. Among these metal catalysts, the zinc catalyst is preferably used in terms of high polymerization activity in polymerization reaction between the epoxide and carbon dioxide. An organozinc catalyst is particularly preferred among the zinc catalysts.

Specific examples of the organozinc catalyst include:

organozinc catalysts such as zinc acetate, diethyl zinc, and dibutyl zinc; and organozinc catalysts obtained by reaction between a zinc compound and compounds such as primary amine, dihydric phenol, divalent aromatic carboxylic acid, aromatic hydroxy acid, aliphatic dicarboxylic acid, and aliphatic monocarboxylic acid.

According to a preferred aspect, an organozinc catalyst obtained by reaction of a zinc compound with an aliphatic dicarboxylic acid and an aliphatic monocarboxylic acid is adopted from among these organozinc catalysts for higher polymerization activity.

The amount of the metal catalyst used for the polymerization reaction is preferably 0.001 to 20 parts by mass and more preferably 0.01 to 10 parts by mass with respect to 100 parts by mass of the epoxide. The polymerization reaction may be unlikely to progress if the amount of the used metal catalyst is less than 0.001 parts by mass. In contrast, if the amount of the used metal catalyst exceeds 20 parts by mass, effects in accord with the amount of use may not be obtained, which may be economically undesirable.

A reaction solvent to be used as necessary in the polymerization reaction is not particularly limited. Any type of an organic solvent can be adopted as the reaction solvent. Specific examples of the organic solvent include:

aliphatic hydrocarbon solvents such as pentane, hexane, octane, decane, and cyclohexane;

aromatic hydrocarbon solvents such as benzene, toluene, and xylene;

halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; and carbonate solvents such as dimethyl carbonate, diethyl carbonate, and propylene carbonate.

The amount of the used reaction solvent is preferably 500 parts by mass or more and 10000 parts by mass or less with respect to 100 parts by mass of the epoxide in terms of smooth reaction.

The method for causing the reaction between an epoxide and carbon dioxide in the presence of a metal catalyst is not particularly limited in the polymerization reaction described above. For example, an adoptable method includes charging in an autoclave the epoxide, the metal catalyst, and a reaction solvent as necessary, mixing these components, and then injecting carbon dioxide under pressure for reaction.

The pressure under which carbon dioxide is used in the polymerization reaction is not particularly limited. Typically, the pressure is preferably from 0.1 MPa to 20 MPa, more preferably from 0.1 MPa to 10 MPa, and even more preferably from 0.1 MPa to 5 MPa. If carbon dioxide is used at a pressure exceeding 20 MPa, effects in accord with the amount of use may not be obtained, which may be economically undesirable.

The polymerization reaction temperature in the above polymerization reaction is not particularly limited. The typical polymerization reaction temperature is preferably from 30 to 100° C. and more preferably from 40 to 80° C. If the polymerization reaction temperature is lower than 30° C., the polymerization reaction may take a long period. In contrast, if the polymerization reaction temperature exceeds 100° C., side reaction may occur to reduce a yield. The period of the polymerization reaction is typically preferred to be from 2 to 40 hours, although the period differs depending on the polymerization reaction temperature and cannot be determined generally.

After the completion of the polymerization reaction, the aliphatic polycarbonate will be obtained by filtration or the like, and washing with a solvent or the like as necessary, followed by drying.

Different Embodiment 3

In the imprinting step according to the first embodiment, preferably, mold releasing treatment is preliminarily applied to the surface of each precursor layer to be in contact with an imprinting surface and/or to the imprinting surface of the mold, and each precursor layer is then subjected to imprinting. Such treatment can decrease frictional force between each precursor layer and the mold. Each precursor layer can thus be subjected to imprinting with higher accuracy. Examples of an applicable mold releasing agent in the mold releasing treatment include surfactants (e.g. a fluorosurfactant, a silicone surfactant, and a non-ionic surfactant), and diamond-like carbon containing fluorine.

The thin film transistors 100 and 200 exemplifying a semiconductor device are described in the above embodiments. However, these embodiments are not limitedly applicable to a thin film transistor. For example, the techniques or technical ideas disclosed or suggested in the above embodiments are applicable to various semiconductor devices to which a self-aligning technique is applicable.

As described above, the above embodiments have been disclosed not for limiting the present invention but for describing these embodiments. Furthermore, modification examples made within the scope of the present invention, inclusive of other combinations of the embodiments, will also be included in the scope of the patent claims.

INDUSTRIAL APPLICABILITY

The present invention is widely applicable to the field of electronic devices such as mobile terminals, information appliances, sensors, other known electric appliances, micro electro mechanical systems (MEMS), nano electro mechanical systems (NEMS), and medical equipment including various types of semiconductor devices.

DESCRIPTION OF REFERENCE SIGNS

10 Substrate
20 Semiconductor layer
30 Gate insulator
40 Gate electrode layer
50 Aliphatic polycarbonate layer
100, 200 Thin film transistor
M1 Precursor layer mold

The invention claimed is:

1. A method for producing a semiconductor device, the method comprising:
   an aliphatic polycarbonate layer forming step of forming an aliphatic polycarbonate layer that covers a gate electrode layer disposed above a semiconductor layer, with a gate insulator being interposed between the gate electrode layer and the semiconductor layer, covers the semiconductor layer, and comprises a dopant; and
   a heating step of heating the aliphatic polycarbonate layer at a temperature to cause introduction of the dopant into the semiconductor layer and decomposition of the aliphatic polycarbonate layer.

2. The method for producing the semiconductor device according to claim 1, wherein
   the semiconductor layer is a first material layer,
   the first material layer is an oxide layer including one, two, or more metals selected from the group consisting of indium (In), tin (Sn), zinc (Zn), cadmium (Cd), zirconium (Zr), gallium (Ga), antimony (Sb), and copper (Cu), or a layer including a member selected from the group consisting of silicon (Si) and a silicon compound, and
   the dopant is an n-type dopant, and includes one, two, or more elements selected from the group consisting of tin (Sn), fluorine (F), antimony (Sb), indium (In), gallium (Ga), phosphorus (P), arsenic (As), and aluminum (Al).

3. The method for producing the semiconductor device according to claim 1, wherein
   the semiconductor layer is a second material layer,
   the second material layer is an oxide layer or a sulfide layer including one, two, or more metals selected from the group consisting of copper (Cu), aluminum (Al), gallium (Ga), strontium (Sr), lanthanum (La), selenium (Se), zinc (Zn), zirconium (Zr), and antimony (Sb), or a layer including a member selected from the group consisting of silicon (Si) and a silicon compound, and
   the dopant is a p-type dopant, and includes one, two, or more elements selected from the group consisting of tin (Sn), fluorine (F), antimony (Sb), indium (In), gallium (Ga), aluminum (Al), boron (B), and magnesium (Mg).

4. The method for producing the semiconductor device according to claim 1, wherein
   the heating step includes a step of irradiating the aliphatic polycarbonate layer with ultraviolet rays (UV) in an ozone ($O_3$) atmosphere.

5. The method for producing the semiconductor device according to claim 1, wherein
   the aliphatic polycarbonate is at least one member selected from the group consisting of polyethylene carbonate and polypropylene carbonate.

6. The method for producing the semiconductor device according to claim 1, wherein
   the aliphatic polycarbonate is polypropylene carbonate, and an amount of the dopant is 0.05 mol or more and 0.1 mol or less with respect to 1 kg of the polypropylene carbonate alone.

7. An apparatus for producing a semiconductor device, the apparatus comprising:
   a layer formation system to form an aliphatic polycarbonate layer that covers a gate electrode layer disposed above a semiconductor layer, with a gate insulator being interposed between the gate electrode layer and the semiconductor layer, covers the semiconductor layer, and comprises a dopant; and
   a heating system to heat the aliphatic polycarbonate layer at a temperature to cause introduction of the dopant into the semiconductor layer and decomposition of the aliphatic polycarbonate layer.

8. The apparatus for producing the semiconductor device according to claim 7, wherein
   the semiconductor layer is a first material layer,
   the first material layer is an oxide layer including one, two, or more metals selected from the group consisting of indium (In), tin (Sn), zinc (Zn), cadmium (Cd), zirconium (Zr), gallium (Ga), antimony (Sb), and copper (Cu), or a layer including a member selected from the group consisting of silicon (Si) and a silicon compound, and
   the dopant is an n-type dopant, and includes one, two, or more elements selected from the group consisting of tin (Sn), fluorine (F), antimony (Sb), indium (In), gallium (Ga), phosphorus (P), arsenic (As), and aluminum (Al).

9. The apparatus for producing the semiconductor device according to claim 7, wherein
   the semiconductor layer is a second material layer,
   the second material layer is an oxide layer or a sulfide layer including one, two, or more metals selected from the group consisting of copper (Cu), aluminum (Al), gallium (Ga), strontium (Sr), lanthanum (La), selenium (Se), zinc (Zn), zirconium (Zr), and antimony (Sb), or a layer including a member selected from the group consisting of silicon (Si) and a silicon compound, and the dopant is a p-type dopant, and includes one, two, or more elements selected from the group consisting of tin (Sn), fluorine (F), antimony (Sb), indium (In), gallium (Ga), aluminum (Al), boron (B), and magnesium (Mg).

10. The apparatus for producing the semiconductor device according to claim 7, wherein
the heating system is to irradiate the aliphatic polycarbonate layer with ultraviolet rays (UV) in an ozone ($O_3$) atmosphere.

11. The apparatus for producing the semiconductor device according to claim 7, wherein
the aliphatic polycarbonate is at least one member selected from the group consisting of polyethylene carbonate and polypropylene carbonate.

12. The apparatus for producing the semiconductor device according to claim 7, wherein
the aliphatic polycarbonate is polypropylene carbonate, and an amount of the dopant is 0.05 mol or more and 0.1 mol or less with respect to 1 kg of the polypropylene carbonate alone.

13. A method for producing an intermediate semiconductor device, the method comprising:
an aliphatic polycarbonate layer forming step of forming an aliphatic polycarbonate layer that covers a gate electrode layer disposed above a semiconductor layer, covers the semiconductor layer, and comprises a dopant,
wherein a gate insulator is interposed between the gate electrode layer and the semiconductor layer.

14. The method for producing the intermediate semiconductor device according to claim 13, wherein
the semiconductor layer is a first material layer,
the first material layer is an oxide layer including one, two, or more metals selected from the group consisting of indium (In), tin (Sn), zinc (Zn), cadmium (Cd), zirconium (Zr), gallium (Ga), antimony (Sb), and copper (Cu), or a layer including a member selected from the group consisting of silicon (Si) and a silicon compound, and
the dopant is an n-type dopant, and includes one, two, or more elements selected from the group consisting of tin (Sn), fluorine (F), antimony (Sb), indium (In), gallium (Ga), phosphorus (P), arsenic (As), and aluminum (Al).

15. The method for producing the intermediate semiconductor device according to claim 13, wherein
the semiconductor layer is a second material layer,
the second material layer is an oxide layer or a sulfide layer including one, two, or more metals selected from the group consisting of copper (Cu), aluminum (Al), gallium (Ga), strontium (Sr), lanthanum (La), selenium (Se), zinc (Zn), zirconium (Zr), and antimony (Sb), or a layer including a member selected from the group consisting of silicon (Si) and a silicon compound, and
the dopant is a p-type dopant, and includes one, two, or more elements selected from the group consisting of tin (Sn), fluorine (F), antimony (Sb), indium (In), gallium (Ga), aluminum (Al), boron (B), and magnesium (Mg).

16. The method for producing the intermediate semiconductor device according to claim 13, wherein
the aliphatic polycarbonate is at least one member selected from the group consisting of polyethylene carbonate and polypropylene carbonate.

17. The method for producing the intermediate semiconductor device according to claim 13, wherein
the aliphatic polycarbonate is polypropylene carbonate, and an amount of the dopant is 0.05 mol or more and 0.1 mol or less with respect to 1 kg of the polypropylene carbonate alone.

* * * * *